United States Patent [19]
Kim et al.

[11] Patent Number: 6,065,381
[45] Date of Patent: May 23, 2000

[54] APPARATUS FOR CUTTING TIE BARS OF SEMICONDUCTOR PACKAGES

[75] Inventors: Jong-won Kim, Asan; Young-jin Choi, Cheonan; Po-seong Park, Cheonan; Jun-young Ko, Cheonan, all of Rep. of Korea

[73] Assignee: Samsung Electronics Co., Ltd., Suwon, Rep. of Korea

[21] Appl. No.: 09/044,905

[22] Filed: Mar. 20, 1998

[30] Foreign Application Priority Data

Sep. 13, 1997 [KR] Rep. of Korea ............. 97-47401

[51] Int. Cl.[7] ...................................... B26D 7/18
[52] U.S. Cl. ................ 83/98; 83/686; 83/929.1; 83/929.2
[58] Field of Search ................ 83/98, 99, 929.2, 83/620, 637, 402, 100, 682, 683, 684, 685, 686, 929.1

[56] References Cited

U.S. PATENT DOCUMENTS

| | | | |
|---|---|---|---|
| 1,174,349 | 3/1916 | Reynolds | 83/98 |
| 2,442,901 | 6/1948 | Missbach | 83/98 X |
| 4,187,751 | 2/1980 | Barnacle | 83/929.2 X |
| 4,628,780 | 12/1986 | Hicks | 83/98 X |
| 4,836,071 | 6/1989 | Ersoy | 83/637 X |
| 5,096,108 | 3/1992 | Kuze | 83/620 X |

*Primary Examiner*—Rinaldi I. Rada
*Assistant Examiner*—Ana Luna
*Attorney, Agent, or Firm*—Jones Volentine, L.L.P.

[57] ABSTRACT

An apparatus for cutting tie bars of semiconductor packages unloads the semiconductor packages by continuously blowing air against the side of the packages after the tie bars are cut and the semiconductor packages are separated from lead frames. The packages are blown into a guide track which feeds into a storage tube. As a result, damage to the packages due to mechanical abrasion which may result from unloading with a pusher bar is prevented. Furthermore, the time required for unloading the semiconductor packages is reduced.

12 Claims, 4 Drawing Sheets

APPARATUS FOR CUTTING TIE BARS OF SEMICONDUCTOR PACKAGES

BACKGROUND OF THE INVENTION

1. Field of the Invention

The present invention relates to an apparatus for cutting the tie bars of semiconductor packages, and more particularly, to an apparatus for cutting the tie bars of semiconductor packages and unloading the packages by air-blowing after cutting the tie bars.

2. Background of the Related Art

As technology improves in the electronics industry, there has been a trend to provide highly functional and far smaller electronic devices using high density semiconductor devices. Accordingly, developments have occurred in semiconductor packages as well.

In the manufacturing of semiconductor packages, wafers including a plurality of semiconductor chips are subjected to a series of processes: a dicing process to separate wafers into individual semiconductor chips by means of diamond saws; a die bonding process for mounting each of the chips on a die paddle of a lead frame using an adhesive material; a wire bonding process for connecting input and output pads of the chips to an inner lead of the lead frame using an extremely thin metal wire having high conductivity; a molding process for protecting the wire-bonded chips from external conditions such as mechanical shock, moisture and dust particles by encapsulating them with thermosetting resins; a trimming and forming process for trimming and separating the semiconductor packages fabricated as above from a strip of the lead frames; and a marking process for printing a trademark and a package serial number on the thermosetting resin enclosing the respective chips.

More particularly, the trimming and forming process includes a dam bar cutting step for removing dam bars which have been used for preventing the thermosetting resins from flowing out of the respective lead frames during the the molding process. After the dam bar cutting step, outer leads are coated with tin or tin alloy for protection from oxidation. Thereafter, the outer leads are formed into a predetermined shape.

The forming step is carried out through the steps of loading the lead frame strip, including tie bars for connecting the lead frames to the semiconductor packages, and folding the outer leads of the semiconductor packages in stages into a predetermined shape. Generally, the outer leads of a small outline j-bend (SOJ) semiconductor package are successively folded through five molding units having different curvatures. Using the above processes and steps, completed semiconductor package products are manufactured.

The completed semiconductor packages are separated from the lead frames after the tie bars are cut. Thereafter, the semiconductor packages are unloaded by an unloading unit including a push bar that is operated by a cylinder or a knuckle arm. The semiconductor packages are stored in a storage tube as they are pushed and unloaded by horizontal reciprocating movement of the push bar.

However, the semiconductor package unloading unit has disadvantages. The knuckle arm and a spring of the unloading unit may be abraded due to repeated operation. As a result, the push bar may not be accurately reciprocated and the efficiency of the unloading unit may be degraded. Furthermore, the push bar pushes and unloads the semiconductor packages one by one, which is quite time consuming.

SUMMARY OF THE INVENTION

It is therefore an object of the present invention to provide an apparatus for cutting tie bars of semiconductor packages, which is capable of unloading the semiconductor packages by air-blowing, not by any mechanical impact.

The above and other objects are provided according to the present invention by providing an apparatus for cutting tie bars of semiconductor packages, which includes a bottom plate, a plurality of guide columns fixed on a top surface of the bottom plate, a top plate spaced apart from and opposed to the bottom plate, a guide plate located between the bottom plate and the top plate, a pressing and fixing member, a pressing and cutting member and an air blowing member. The top plate is vertically moved up and down by a press with guidance of the plurality of guide columns. In association with the vertical movement of the top plate, the guide plate is also vertically moved up and down with guidance of the plurality of guide columns. The pressing and fixing member presses down onto predetermined portions of the lead frames of a lead frame strip and thereby fixes the lead frame strip according to guidance of the guide plate in association with the vertical movement of the top plate. The pressing and cutting member presses and cuts the tie bars of the semiconductor packages of the lead frame strip that is fixed by the pressing and fixing member according to guidance of the guide plate in association with the vertical movement of the top plate. After being separated from the lead frames by the pressing and cutting member, the semiconductor packages are unloaded by air-blowing from the air blowing member.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

Figure 1:
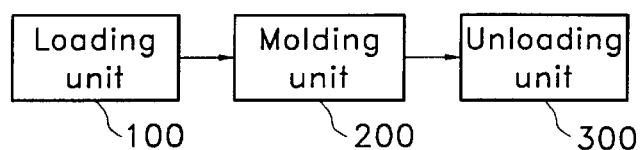
FIG. 1 is a schematic block diagram of a conventional apparatus for fabricating semiconductor packages.

Referring to FIG. 1, a conventional apparatus for fabricating semiconductor packages generally includes a loading unit 100 for loading a lead frame strip including a plurality of semiconductor packages that have been subjected to a molding process and a trimming process. A molding unit 200 then folds the outer leads of the semiconductor packages and cuts the tie bars of the semiconductor packages. Finally, an unloading unit 300 unloads the semiconductor packages which are individually separated by the molding unit 200 into a tube for storage purposes.

Figure 2:
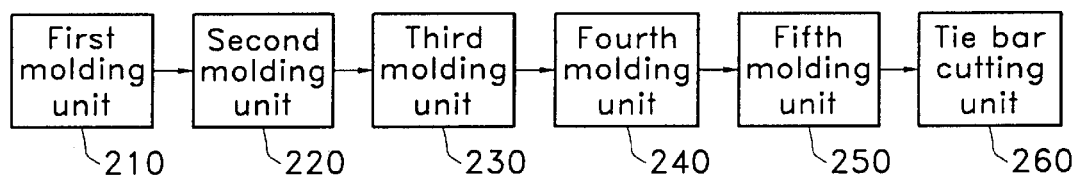
FIG. 2 is a detailed block diagram of the molding unit of FIG. 1.

More specifically, and referring to FIG. 2, the molding unit 200 includes first, second, third, fourth, and fifth molding units 210, 220, 230, 240 and 250, and a tie bar cutting unit 260. The outer leads of the semiconductor packages transferred from the loading unit 100 are successively subjected to the above five molding units 210, 220, 230, 240 and 250, having different curvatures. As a result, the outer leads are formed into a predetermined shape, such that the curved portions of the outer leads are protected from cracking. The plurality of molding units 210, 220, 230, 240 and 250 are generally used for forming outer leads of small outline j-bend (SOJ) type packages.

The tie bar cutting unit 260 cuts the tie bars, which have been used for interconnecting the semiconductor packages and the lead frames. After cutting and separating the semiconductor packages from the lead frames, the tie bar cutting unit 260 unloads the semiconductor packages into the unloading unit 300.

The tie bar cutting unit of the present invention will be described more in detail with reference to FIGS. 3–5.

Figure 3:
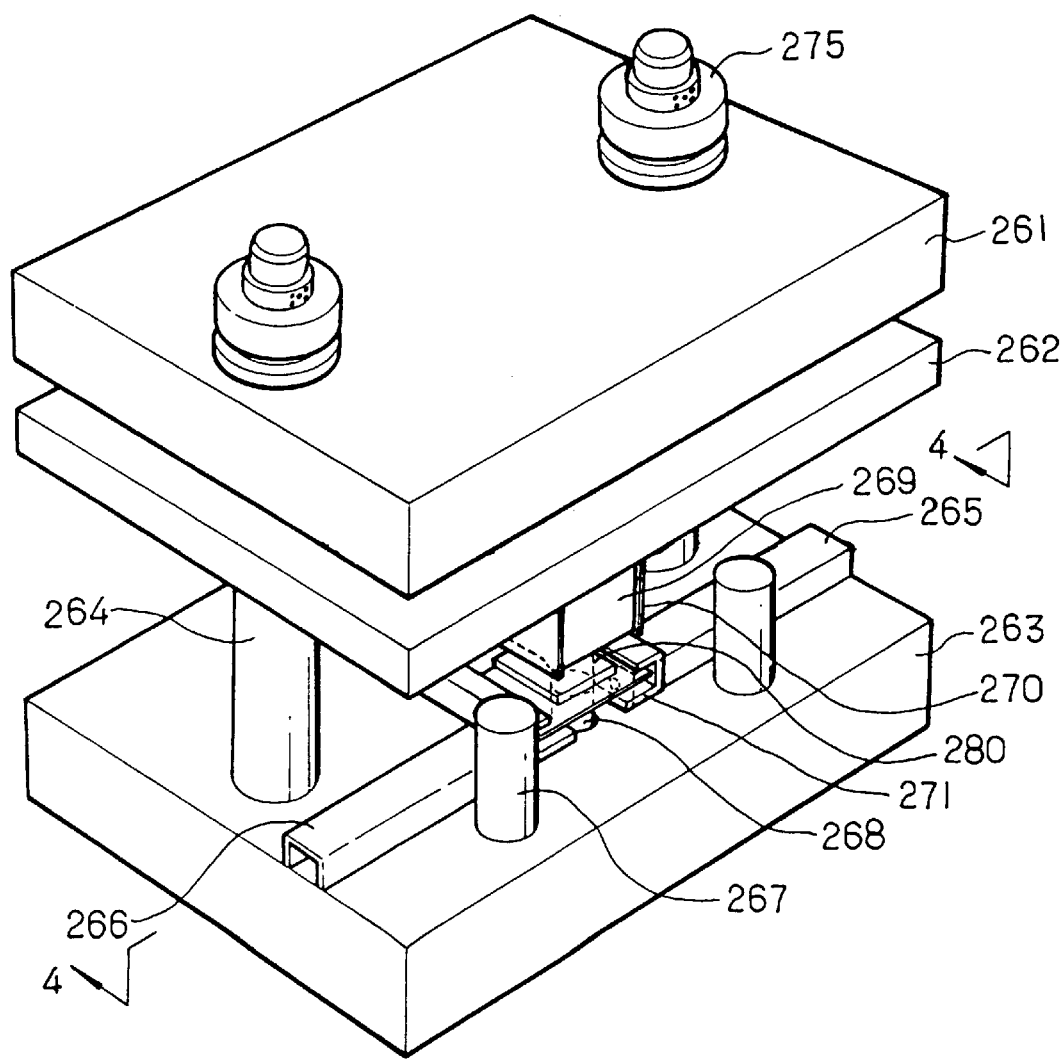
FIG. 3 is a perspective view of an embodiment of an apparatus for cutting tie bars of semiconductor packages according to the present invention.
Figure 4:
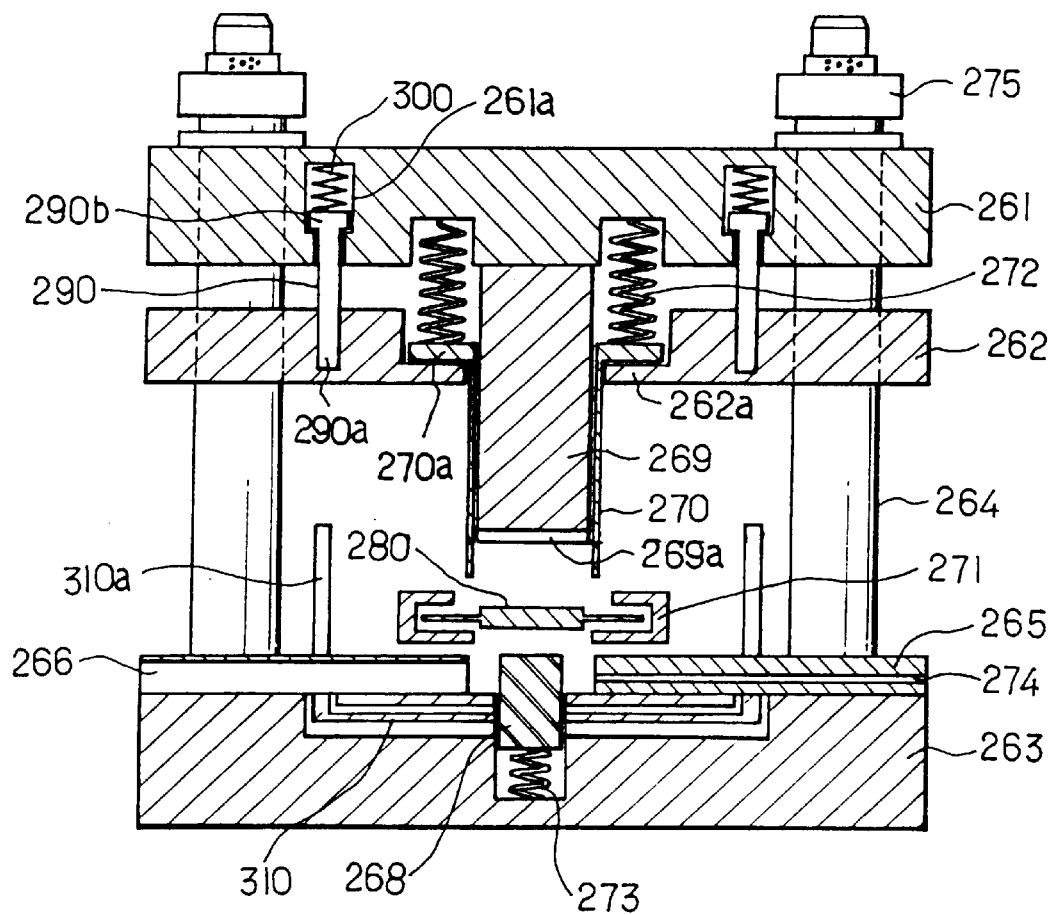
FIG. 4 is a cross-sectional view taken along line 4—4 in FIG. 3.
Figure 5:
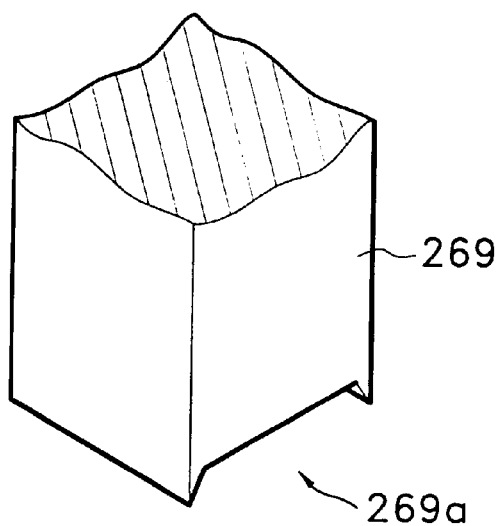
FIG. 5 is a perspective view of an end portion of the punch of the apparatus shown in FIG. 4.

As shown in FIGS. 3 and 4, a bottom plate 263 is horizontally disposed. Two guide columns 264 are vertically mounted on a top surface of the bottom plate 263 in a spaced apart relation from each other by a predetermined distance. A guide plate 262 is installed above and spaced apart from the bottom plate 263. The guide plate 262 is vertically moved up and down with guidance of the guide columns 264. A top plate 261 is installed over and spaced apart from the guide plate 262. The top plate 261 is also vertically moved up and down with guidance of the guide columns 264.

Guide plate 262 is coupled to top plate 261 by a pair of bolts 290 and a pair of springs 300. Each bolt 290 has a first end 290a fixedly attached to guide plate 262 and a bolt head 290b attached to one end of one of the springs 300. The springs 300 and the bolt heads 290b are slidably located inside openings 261a in top plate 261. The opposite end of each spring 300 is attached to an upper inside surface of the opening 261a.

On the top surface of the top plate 261, a press (not shown) is positioned so as to vertically move the top plate 261 up and down. In association with the vertical movement of the top plate 261, the guide plate 262 is accordingly moved up and down, as follows.

As the press begins to move top plate 261 downward, springs 300 are compressed as the bolts 290 slide up into openings 261a. When springs 300 are fully compressed, the bottom surface of top plate 261 comes into contact with the top surface of guide plate 262. At this point, guide plate 262 also moves downward along with top plate 261 due to the action of the press. When top plate 261 reaches its lowest point, springs 300 return to their relaxed position, whereby bolts 290 slide downward in the openings 261a, and thereby pushing guide plate 262 farther downward and out of contact with top plate 261.

The press is used to move top plate 261 upward as well, and guide plate 262 moves upward together with top plate 261, since each bolt head 290b abuts a shoulder at the bottom inside surface of openings 261a.

The upward movement of the top plate 261 is limited by guide column bushes 275 which are formed on the top surface of the guide columns 264. The downward movement of the guide plate 262 is limited by stoppers 267 each of which has a cylindrical shape and is disposed at a predetermined position on the top surface of the bottom plate 263.

In addition, as shown in FIG. 4, a pressing and cutting member, for example, a punch 269, is installed at the center of the bottom surface of the top plate 261. The punch 269 presses and cuts the tie bars that interconnect the semiconductor packages and lead frames, according to the downward movement of the top plate 261. As a result, the semiconductor packages are individually separated from the lead frames. As shown in detail in FIG. 5, punch 269 has a recessed portion 269a at the bottom thereof which accommodates the top portion of the semiconductor packages. The recessed portion 269a of the punch 269 extends across the entire width of the punch 269 as shown in FIG. 5, so as to form an air passage through the punch, as will be described in detail below.

Furthermore, a pressing and fixing member, for example a clamp 270, is installed in connection with the guide plate 262 and the top plate 261 at two locations on opposite sides of the punch 269. The clamp 270 presses and holds a portion of the lead frame connected to the tie bars as the tie bars are cut. Elastic members, for example springs 272, are installed with one end thereof connected to top surfaces of shoulders 270a of clamp 270. The opposite ends of springs 272 are connected to an underside of top plate 261 and each spring 272 is compressed and relaxed according to the movement of the top plate 261 and guide plate 262. The bottom of clamp 270 is lower than the bottom of punch 269 when the springs 272 are in the relaxed position, but the bottom of punch 269 extends below the bottom of clamp 270 when the springs 272 are fully compressed by the downward movement of top plate 261 and guide plate 262.

The bottom surface of each shoulder 270a rests on top of a portion 262a of guide plate 262. Guide plate 262 has a hole through which the clamp 270 and punch 269 pass, the hole being formed adjacent to the portion 262a on which the shoulder 270a rests. The guide plate 262 guides clamp 270 to move straight down.

In addition, a supporting member, for example a supporting mold 268 having a cylindrical shape, fits into the center of the bottom plate 263 and is located opposite the punch 269. A spring 273 is connected to the bottom of the supporting mold 268 so that the top portion thereof projects out of the bottom plate 263. A pair of L-shaped bars 310 are connected to the supporting mold 268, and vertical portions 310a of the L-shaped bars 310 extend through the top surface of bottom plate 263 and upward to cooperate with guide plate 262. When guide plate 262 moves down, it contacts the vertical portions 310a and pushes downward on the L-shaped bars and compresses spring 273 so that supporting mold 268 moves downward. When guide plate 262 moves upward, the spring 273 returns to its relaxed position, and supporting mold 268 moves upward to its original position.

Figure 6:
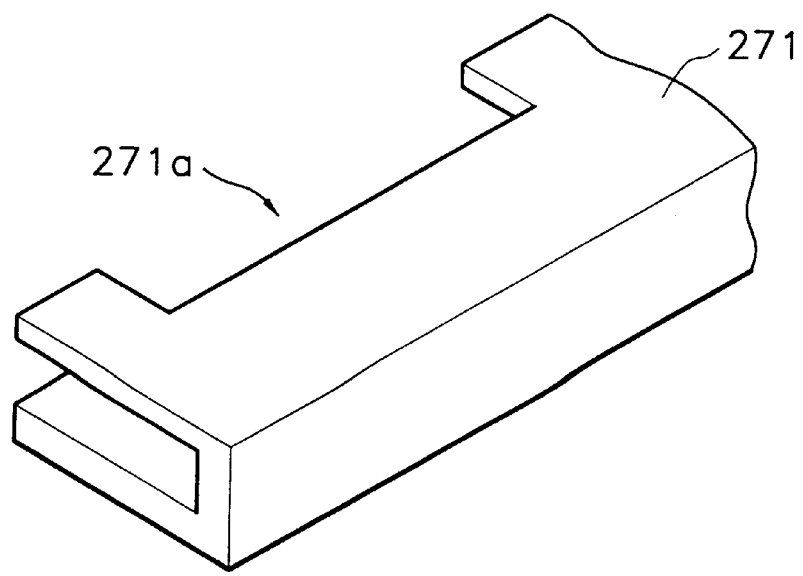
FIG. 6 is a perspective view of a portion of the guide rail of the apparatus shown in FIG. 4.

A guide rail 271 is installed between the punch 269 and the supporting mold 268 in order to guide the movement of the lead frame strip. The lead frame strip which has been processed through the five different molding units 210, 220, 230, 240 and 250 is inserted into the guide rail 271. At this time, the two long sides of the lead frame strip are guided by the guide rail 271. The guide rail 271 is equipped with rollers or the like (not shown), so that the lead frame strip is moved through the guide rail 271 by a predetermined amount, and the semiconductor packages are moved one by one into the space between the punch 269 and the supporting mold 268. As shown in FIG. 6, each guide rail 271 has an opening 271a to provide clearance for the clamp 270 to reach down to the lead frame strip.

The semiconductor packages which have been separated from the lead frame strip by the punch 269 are guided and transferred by a guiding and transferring member, for example a guide track 266, which is installed at a side of the supporting mold 268 under the guide rail 271.

An air blowing member 265 is installed at the other side of the supporting mold 268 under the guide rail 271, opposite the guide track 266. The air blowing member 265 continuously blows air at a predetermined pressure against an end of the semiconductor package so that the semiconductor package is blown into the guide track 266.

At this time, the predetermined air pressure suitable for moving the semiconductor package into the guide track 266 is in a range of from 3 to 5 kgf/cm$^2$. More preferably, the air pressure is 4 kgf/cm$^2$.

In the air blowing member 265, a tube 274 having a predetermined diameter corresponding to the air pressure is formed. Preferably, the tube 274 has a diameter of approximately 2 mm. The air blowing member 265 may be formed of metal, plastic material and the like. Preferably, the air blowing member 265 is formed of metal, for example, an aluminum alloy according to operating conditions of the tie bar cutting unit.

The diameter of the tube 274 may be modified according to the air pressure and the size of the semiconductor package. A plurality of tubes 274 may be formed according to the size of the semiconductor packages.

For example, two tubes 274 for blowing air may be formed at locations opposite the two ends of a side of the semiconductor package having a predetermined size. This results in stable movement of the semiconductor package into the guide track 266. The reference number 280 represents the lead frame strip having a plurality of semiconductor packages.

The tube 274 of the air blowing member 265, the guide track 266 and the semiconductor packages should be located along a straight line for smooth transfer of the semiconductor packages into the guide track 266 when air is blown against them.

Preferably, in order to maximize the transferring efficiency, an end of the semiconductor package is spaced apart from an end of the tube 274 by approximately 2 to 3 mm.

The operation of the tie bar cutting unit will be described in detail hereinafter. First, a lead frame strip processed through the five different molding units 210, 220, 230, 240 and 250 is transferred along the guide rail 271 by a transferring unit (not shown) so that a semiconductor package of the lead frame strip rests on the top surface of the supporting mold 268.

Thereafter, a press (not shown) presses the top plate 261. As a result, the top plate 261 is moved down with guidance of the guide columns 264. When the top plate 261 is moved down, the punch 269 is accordingly moved down. The clamp 270 is then also moved down once the springs 272 are fully compressed. The clamp 270 presses and fixes a portion of the lead frame connected to the tie bars with the guidance of the guide plate 262. The punch 269 presses the molded portion of the semiconductor package and separates the package from the lead frame by cutting the tie bar that interconnects the package and the lead frame.

After separating the semiconductor package from the lead frame, the punch 269 is vertically moved down until the separated package is inserted between the guide track 266 and the tube 274. At this time, the supporting mold 268 that supports the bottom of the molded portion of the package is moved down in association with the downward movement of the guide plate 262 and the L-shaped bars 310 according to the downward movement of the top plate 261 to a predetermined depth.

As described above, the presence of the recessed portion 269a in punch 269 means that the two sides of the punch 269 which are respectively opposed to the guide track 266 and the tube 274 are open. Accordingly, the semiconductor package is blown into the guide track 266 by air blowing from the tube 274, when the passage formed by recessed portion 269a of the punch 269 is level with the guide track 266. The semiconductor packages pushed and unloaded by the blowing air are stored in a storage tube (not shown).

In other words, when the semiconductor packages are vertically moved down by the punch and the supporting mold, the guide track, the semiconductor package, and the air blowing member come into a straight line, at which time the semiconductor package separated from the lead frame is transferred into the guide track by air blowing through the tube of the air blowing member. Mechanical impact which has been used for pushing and unloading semiconductor packages in the conventional art is not used in the present invention. Instead of using mechanical impact, for example impact by horizontal reciprocating movement of a push bar, the present invention provides an air blowing member. Therefore, the present invention is capable of reducing the mechanical abrasion that may be caused by mechanical impact. Operational failure of the push bar is also avoided. This results in reduced work time and enhanced operational efficiency.

This invention has been described above with reference to the aforementioned embodiment. It is evident, however, that many alternatives, modifications and variations will be apparent to those skilled in the art in light of the foregoing description. Accordingly, the invention is intended to embrace all such alternatives, modifications and variations as fall within the spirit and scope of the appended claims.

What is claimed is:

1. An apparatus for cutting tie bars of semiconductor packages, comprising:

a bottom plate;

a plurality of guide columns which are vertically fixed, at predetermined distances from each other, to a top surface of said bottom plate;

a top plate which is upwardly spaced apart from said bottom plate and vertically moved up and down by a press with guidance of said plurality of guide columns;

a guide plate which is located between said bottom plate and said top plate and which vertically moves up and down with guidance of said plurality of guide columns in association with vertical movement of said top plate;

a pressing and fixing member which presses and fixes a predetermined portion of a lead frame of a lead frame strip in association with vertical movement of said top plate with guidance of said guide plate;

a pressing and cutting member which presses and separates the semiconductor package of the lead frame strip that is pressed and fixed by said pressing and fixing member, in association with the vertical movement of said top plate with guidance of said guide plate, from a lead frame of the lead frame strip; and an air blowing member which unloads the semiconductor package that is separated from the lead frame by said pressing and cutting member by blowing air having a predetermined pressure against a side of the semiconductor package, wherein the pressing and cutting member includes a recessed portion that extends across the width of the pressing and cutting member, and that accommodates the top portion of the semiconductor package, and wherein the recessed portion forms an air passage allowing the blown air to pass through the pressing and cutting member and unload the semiconductor package.

2. The apparatus for cutting tie bars of semiconductor packages according to claim 1, further comprising a guiding and transferring member located across from said air blowing member, which guides and transfers the semiconductor package unloaded by said air blowing member into a storage member.

3. The apparatus for cutting tie bars of semiconductor packages according to claim 2, further comprising a supporting member which is installed between said guiding and transferring member and said air blowing member, and supports a bottom of the semiconductor package after separation from the lead frame strip.

4. The apparatus for cutting tie bars of semiconductor packages according to claim 3, wherein said supporting member is moved in association with vertical movement of said guide plate.

5. The apparatus for cutting tie bars of semiconductor packages according to claim 2, wherein said air blowing member blows air continuously at a predetermined pressure.

6. The apparatus for cutting tie bars of semiconductor packages according to claim 2, wherein said air blowing member is spaced apart from the semiconductor package separated from said lead frame by approximately 2 to 3 mm.

7. The apparatus for cutting tie bars of semiconductor packages according to claim 5, wherein said air blowing from said air blowing member has a pressure of approximately 3 to 5 kgf/cm$^2$.

8. The apparatus for cutting tie bars of semiconductor packages according to claim 7, wherein said air blowing from said air blowing member has a pressure of 4 kgf/cm$^2$.

9. The apparatus for cutting tie bars of semiconductor packages according to claim 7, wherein said air blowing member comprises a tube having a diameter of approximately 2 mm.

10. The apparatus for cutting tie bars of semiconductor packages according to claim 9, wherein said air blowing member comprises a plurality of tubes.

11. The apparatus for cutting tie bars of semiconductor packages according to claim 2, wherein said air blowing member is formed of metal.

12. The apparatus for cutting tie bars of semiconductor packages according to claim 11, wherein said metal is aluminum alloy.

* * * * *